(12) United States Patent
Benbassat

(10) Patent No.: US 9,210,796 B2
(45) Date of Patent: Dec. 8, 2015

(54) LIGHT SOURCE MOUNT

(75) Inventor: David Benbassat, Ganey Tikva (IL)

(73) Assignee: COLORCHIP (ISRAEL) LTD. (IL)

(*) Notice: Subject to any disclaimer, the term of this patent is extended or adjusted under 35 U.S.C. 154(b) by 184 days.

(21) Appl. No.: 13/818,690

(22) PCT Filed: Aug. 24, 2011

(86) PCT No.: PCT/IB2011/053709
§ 371 (c)(1),
(2), (4) Date: Feb. 25, 2013

(87) PCT Pub. No.: WO2012/025888
PCT Pub. Date: Mar. 1, 2012

(65) Prior Publication Data
US 2013/0153281 A1    Jun. 20, 2013

Related U.S. Application Data

(60) Provisional application No. 61/376,281, filed on Aug. 24, 2010.

(51) Int. Cl.
| | |
|---|---|
| H05K 1/11 | (2006.01) |
| H05K 1/02 | (2006.01) |
| H01L 23/498 | (2006.01) |
| H01L 33/48 | (2010.01) |
| H01L 33/62 | (2010.01) |
| H01S 5/022 | (2006.01) |

(52) U.S. Cl.
CPC ............ *H05K 1/02* (2013.01); *H01L 23/49805* (2013.01); *H01L 33/486* (2013.01); *H01L 33/62* (2013.01); *H01S 5/02236* (2013.01); *H01S 5/02256* (2013.01); *H01L 2924/0002* (2013.01)

(58) Field of Classification Search
CPC . H01L 23/49805; H01L 33/486; H01L 33/62; H01L 2924/0002; H01L 2924/00; H01S 5/02236; H01S 5/02256; H05K 1/02
USPC ........... 174/260–266; 361/760, 743, 778, 789
See application file for complete search history.

(56) References Cited

U.S. PATENT DOCUMENTS

| | | | | |
|---|---|---|---|---|
| 5,304,743 | A | * | 4/1994 | Sen et al. ................. 174/262 |
| 5,488,765 | A | * | 2/1996 | Kubota et al. .............. 29/593 |
| 5,731,222 | A | * | 3/1998 | Malloy et al. ............. 438/113 |
| 5,802,688 | A | * | 9/1998 | Tanaka ................... 29/25.42 |
| 5,832,600 | A | * | 11/1998 | Hashimoto ................ 29/841 |

(Continued)

FOREIGN PATENT DOCUMENTS

JP        06096992        4/1994

OTHER PUBLICATIONS

International Search Report dated Jul. 23, 2012 for PCT/IB2011/053709; international filed Aug. 24, 2011.

(Continued)

*Primary Examiner* — Hoa C Nguyen
(74) *Attorney, Agent, or Firm* — A.C. Entis-IP Ltd.

(57) ABSTRACT

A mount for a semiconductor device, the mount comprising: an insulating substrate having first and second parallel face surfaces, an edge surface that connects the parallel surfaces and having formed therein a recess having an opening on the first face surface; an electrically conductive plug seated in the recess and having a first exposed surface on or near the edge surface and a second exposed surface on or near the first face surface.

14 Claims, 7 Drawing Sheets

(56) References Cited

U.S. PATENT DOCUMENTS

| | | | |
|---|---|---|---|
| 5,880,011 A * | 3/1999 | Zablotny et al. | 438/462 |
| 6,025,998 A * | 2/2000 | Kitade et al. | 361/800 |
| 6,639,311 B2 * | 10/2003 | Sakai et al. | 257/700 |
| 7,851,278 B2 * | 12/2010 | Nishi et al. | 438/149 |
| 8,592,958 B2 * | 11/2013 | Ko et al. | 257/660 |
| 2002/0122301 A1 * | 9/2002 | Sakai | 361/748 |
| 2004/0094834 A1 * | 5/2004 | Jun et al. | 257/700 |
| 2004/0179793 A1 | 9/2004 | McColloch et al. | |
| 2009/0230420 A1 | 9/2009 | Bogner et al. | |
| 2010/0200888 A1 * | 8/2010 | Kuhmann et al. | 257/99 |

OTHER PUBLICATIONS

Approaching the Zettabyte Era; White Paper; 2008 Cisco Systems, Inc.

* cited by examiner

LIGHT SOURCE MOUNT

RELATED APPLICATIONS

The present application is a US National Phase of PCT Application No. PCT/IB2011/053709, filed on Aug. 24, 2011, which claims the benefit under 35 U.S.C. §119(e) of U.S. Provisional 61/376,281 filed on Aug. 24, 2010, the disclosure of which is incorporated herein by reference.

TECHNICAL FIELD

Embodiments of the invention relate to methods and device for supporting a semiconductor light source and providing electrical connections to the light source.

BACKGROUND

Semiconductor light sources, such as light emitting diodes (LEDs) and laser diodes (LDs) are used to provide illumination, optical radar and signaling in optical communication networks. They are used to transduce electrical signals to optical signals that carry information via optical fibers in the physical infrastructures of the various local and global communications networks to support the rich menu of voice, video, text, and data services that are the backbone of modern society and its activities.

The amount of information transferred over the communication networks is growing at a staggering rate. A white paper published in 2008 by Cisco Systems Inc. entitled "Approaching the Zettabyte Era" predicted that global IP traffic will increase from about 10 exabytes per month in 2008 to over 40 exabytes per month in 2012. The rapid increase in global communication traffic has generated a need for communications equipment that can not only support the increased traffic rates with greater optical signaling rates, but can provide the support in ever smaller physical packaging.

As optical signaling rates provided by communication equipment increase and size of the equipment shrinks, the LEDs and LDs, hereinafter generically referred to as LDs, that generate optical communication signals are required to operate at ever higher frequencies and to be packaged in ever increasing spatial densities. The increasing operating frequencies and packaging densities results in continually increasing severity of constraints to be met by mounts that physically support the LDs. The mounts are advantageously configured to provide the LDs with appropriate electrical connections to circuits that drive and control them in an increasingly crowded component environment, to dissipate increasing amounts of heat they generate during operation, and to provide for convenient alignment of the LDs with optical fibers that receive optical signal they generate. Commercial constraints generally require that the mounts, conventionally referred to as "sub-mounts", also be relatively easy to produce in large quantities and to be relatively inexpensive.

SUMMARY

An aspect of an embodiment of the invention relates to providing a semiconductor light source mount, hereinafter referred to as a "smart mount", comprising a substrate having two parallel face surfaces, an edge surface connecting and optionally perpendicular, to the face surfaces and an electrically conductive contact plug secured in a recess of the substrate. The contact plug has a first surface exposed on, or near, one of the face surfaces, and a second surface, hereinafter a "mounting surface", exposed on the edge surface to which an LD to be supported by the smart mount can be mounted and electrically connected. The LD may be mounted to the contact plug mounting surface using any of various materials and techniques, such as bonding with a conductive epoxy or soldering with a suitable solder alloy. Not only does the contact plug provide convenient support and electrical connectivity for an LD mounted to the plug but the mass of the plug conducting material also functions as an advantageous heat sink for heat generated by the LD during operation. In an embodiment of the invention the substrate is formed from a heat conducting ceramic, such as AlN (Aluminum Nitride) and the contact plug is formed form a metal such as Gold, Copper, Silver, or Aluminum or an alloy thereof.

A smart mount, in accordance with an embodiment of the invention, is robust and relatively easy and inexpensive to produce.

An aspect of an embodiment of the invention relates to providing a method of manufacturing a plurality of smart mounts. In an embodiment of the invention, a relatively large wafer of a substrate material having parallel face surfaces is processed to form an array of rows and columns of holes, hereinafter "contact plug holes", that extend into and optionally through, the substrate wafer from a face surface of the wafer. A cross section of each of the contact plug holes parallel to the face surfaces is configured having two relatively large areas, referred to as "wing areas" connected by a relatively narrow neck. The holes are filled with a conductive material to form the contact plugs of the smart mounts.

Following formation of the contact plugs the substrate wafer is diced to provide the smart mounts. Dicing is done by cutting the substrate wafer along lines, referred to as "row cutting lines", parallel to the rows of holes and along cutting lines, referred to as "column cutting lines", parallel to and between columns of holes. A row cutting line may pass substantially through the necks but not through the wing areas of the cross sections of contact plug holes in a row of contact plug holes, through only one of the wing areas of each of the contact plug holes in the row, or between rows of contact plug holes. Row cutting lines that pass through contact plug holes are referred to as "contact plug cutting" lines or "plug cutting lines". Row cutting lines that pass between rows of contact plug holes and column cutting lines are also referred to as die partition lines. Cutting the substrate wafer along the row contact plug cutting lines creates the exposed mounting surfaces of the smart mount contact plugs. Each smart mount conductive contact plug is held securely in place in its plug hole by the narrowing of the hole in the region of the neck, which operates to grip and lock the contact plug in place.

In the discussion, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION

In the following paragraphs of the detailed description, a description of a process for manufacturing a plurality of smart mounts in accordance with an embodiment of the invention is discussed with reference to FIGS. 1A-2C. A method of forming smart mounts having conducting tracks formed in a lithography process is discussed with reference to FIGS. 3A-3D. A variation of the method of manufacturing smart mounts schematically illustrated in FIGS. 1A-2C is shown in and discussed with reference to FIGS. 4A and 4B. FIG. 5 schematically shows another method of manufacturing smart mounts in accordance with an embodiment of the invention.

Figure 1A:
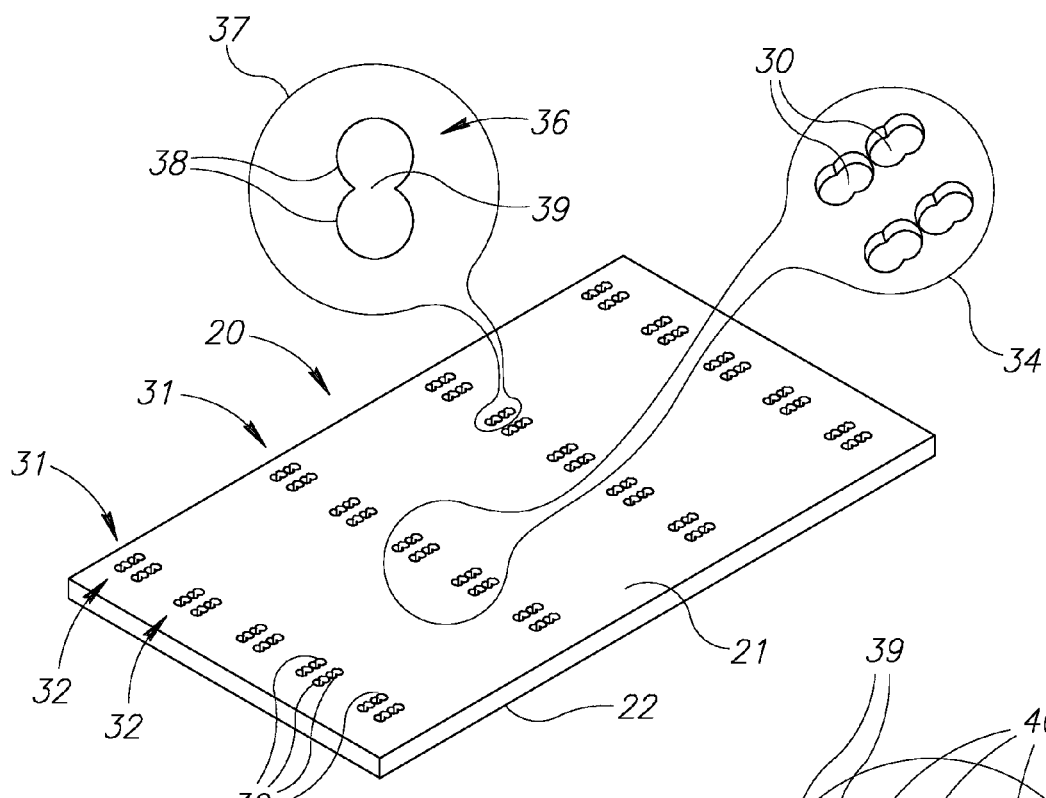
FIG. 1A schematically shows a wafer formed from a substrate material suitable for forming smart mounts and having contact plug holes formed therein in accordance with an embodiment of the invention.

FIG. 1A schematically shows a substrate wafer 20 having top and bottom parallel face surfaces 21 and 22 for manufacturing smart mounts in accordance with an embodiment of the invention. Substrate wafer 20 is formed from an insulating material having a relatively high thermal conductivity, such as an insulating ceramic, and may, by way of example, have thickness in a range from about 0.5 mm to 5 mm and have a square perimeter having a side length of about 100 mm. In an embodiment of the invention substrate wafer 20 may be formed from AlN (Aluminum Nitride). AlN has a thermal conductivity that may range from about 70 W/m/K (Watts per meter per degree Kelvin) to about 210 W/m/K.

In an embodiment of the invention substrate wafer 20 has formed therein rows 31 and columns 32 of optionally through holes 30, also referred to as contact plug holes, 30. To prevent clutter, only some of rows 31 and columns 32 are labeled with numerals. The rows of contact plug holes are optionally configured in pairs of closely spaced rows, with adjacent pairs of rows separated by relatively large distances. Similarly, the columns of contact plug holes are optionally configured in pairs of closely spaced columns, with adjacent pairs of columns separated by relatively large distances. An inset 34 shows an enlarged view of contact plug holes 30. A cross section 36 parallel to face surface 21 of a contact plug hole 30 is shown in an inset 37. Cross section 36 has two wing areas 38 connected by a relatively narrow neck 39 and optionally has a figure eight shape.

Contact plug holes 30 may be formed by any of various methods known in the art such as laser cutting, etching, ablating, or drilling. Forming the holes by drilling may be accomplished by drilling circular holes at a pitch less than a diameter of the holes so that the holes overlap and share a common chord parallel to face surface 21 having length less than the circular hole diameter. Whereas relatively large overlapping holes may be formed in a substrate relatively easily, for example by mechanical drilling and/or laser ablation, a minimum diameter and pitch of the holes are generally determined by wafer thickness and constraints of a process used in forming the holes. For example, minimum diameter and pitch of holes formed by mechanical drilling of a wafer may be constrained to be no less than about 0.8 and about 1.5 times the wafer thickness respectively.

After formation contact plug holes 30 are filled with a conducting material such as a metal, which may be Gold, Copper, Silver or Aluminum or an alloy thereof to form conducting contact plugs embedded in substrate wafer 20. Contact plug holes 30, if large enough or characterized by a small enough ratio (aspect ratio) of hole height to hole diameter, may for example be filled by pouring molten metal onto face surface 21 of substrate wafer 20 so that the metal flows into and fills the holes. Excess metal that remains on face surface 21 may be removed by a suitable etching, abrasion, and/or polishing process, such as a dry or a wet etching process or chemical-mechanical planarization.

Figure 1B:
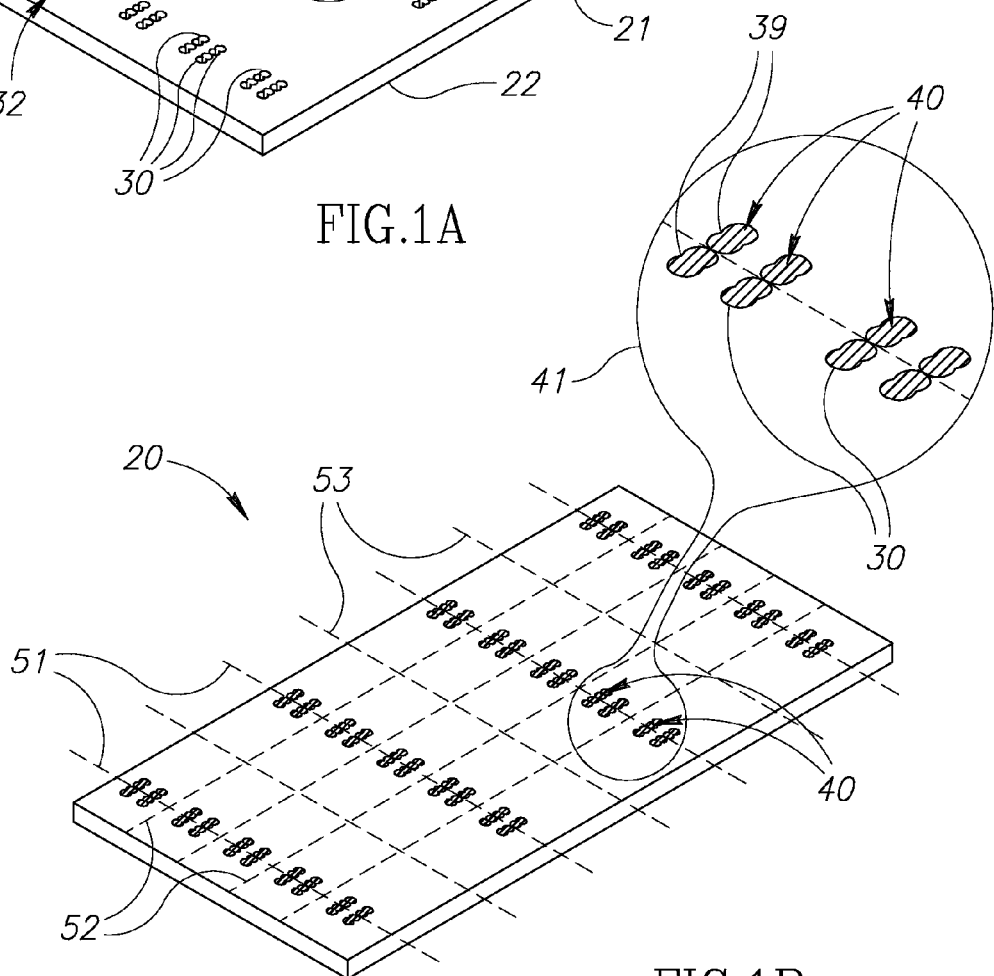
FIG. 1B schematically shows the substrate wafer shown in FIG. 1A with the contact plug holes filled with a conductive material in accordance with an embodiment of the invention.

FIG. 1B schematically shows substrate wafer 20 shown in FIG. 1A after having contact plug holes 30 filled with a conducting material to form contact plugs 40. An inset 41 schematically shows an enlarged view of filled contact plug holes 30. FIG. 1B also shows row cutting lines 51 and 53 and column cutting lines 52, shown in dashed lines. Row cutting lines 51 are contact plug cutting lines and row cutting lines 53 are row die partition cutting lines. Substrate wafer 20 is diced to form smart mounts, in accordance with an embodiment of the invention, by cutting the substrate wafer along the cutting lines.

Each contact plug cutting line 53 optionally lies between contact plug holes 30 in a pair of closely spaced rows of contact plugs 40. In an embodiment of the invention, when substrate wafer 20 is cut along a contact plug cutting line 53, an amount of material removed from the wafer and each contact plug 40 along the cutting line is sufficient to form an exposed surface of the plug that lies on a surface of the substrate material formed by the cut. The exposed surface is configured to have dimensions so that it may function as a mounting surface of the contact plug to which, by way of example, an LD may be mounted to physically support the LD and provide it with electrical connections to a driving circuit. Neck region 39 of the contact plug hole in which the contact plug is formed is displaced from the mounting surface and functions to prevent the contact plug from separating from the substrate material after substrate wafer is cut.

By way of numerical example, assuming that contact plug holes 30 are formed in wafer 20 having thickness equal to about 0.5 mm by drilling overlapping circular holes having a diameter equal to about 0.4 mm in the wafer, contact plug mounting surfaces may have a width in a direction parallel to contact plug cutting lines 51 equal to about 0.2 mm. And neck region 39 of the plug may be displaced about 0.1 mm from the mounting surface.

Figure 2A:
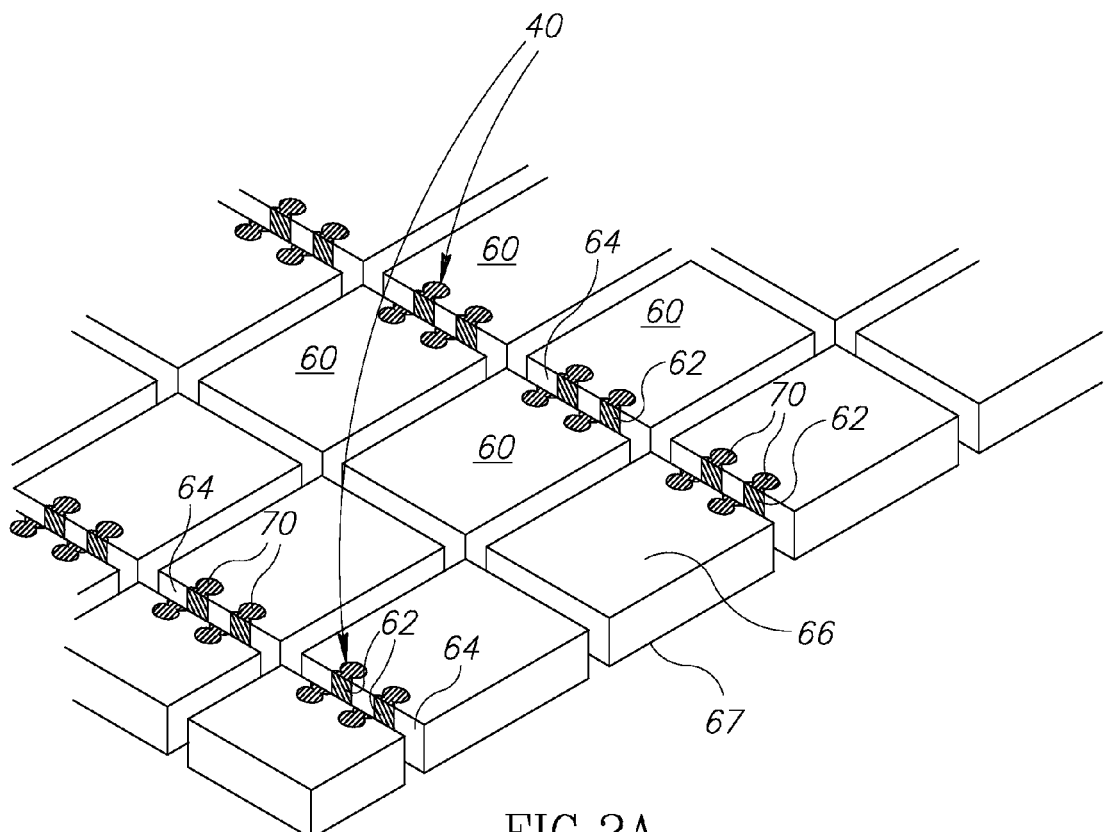
FIG. 2A schematically shows the substrate wafer having filled contact plug holes shown in FIG. 1B after the substrate wafer has been diced, in accordance with an embodiment of the invention.

A portion of substrate wafer 20 after the substrate wafer is diced is shown in FIG. 2A. The figure shows individual smart mounts 60 resulting from the dicing and features of the smart mounts, in accordance with an embodiment of the invention. Mounting surfaces of contact plugs 40 formed during the dicing process and comprised in each smart mount 60 are labeled with a numeral 62. Contact plug mounting surfaces 62 are exposed on edge surfaces 64 of the smart mounts that are formed when substrate wafer 20 is cut along plug cutting lines 51 (FIG. 1B).

Figure 2B:
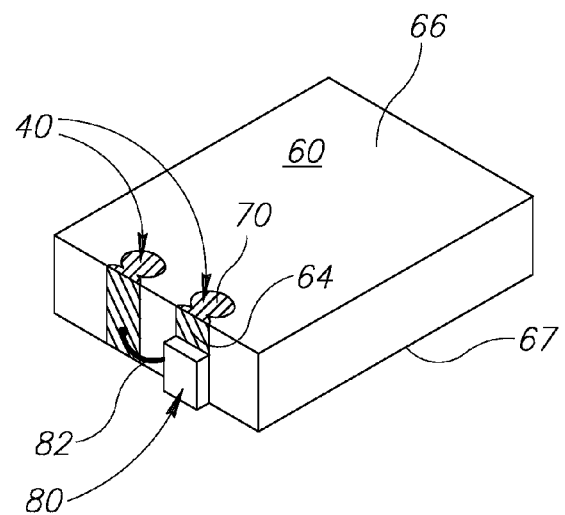
FIG. 2B schematically shows an LD mounted to a contact plug of a single smart mount formed by dicing the substrate wafer shown in FIG. 2A, in accordance with an embodiment of the invention.

Portions of top and bottom surfaces 21 and 22 of substrate wafer 20 (FIG. 1A) that are comprised in a smart mount 60 are referred to as top and bottom surfaces 66 and 67 respectively of the smart mount shown in FIG. 2B. In the perspective of FIG. 2A bottom surfaces 67 of smart mounts 60 are not shown. Bottom surface 67 is indicated in FIG. 2B. A surface 70, also referred to as a contact pad 70, of a contact plug 40 comprised in each smart mount 60 is exposed on top surface 66. Optionally, contact pad 70 has a mirror image contact pad on bottom surface 67.

In an embodiment of the invention, following forming, referred to as "singulation", of individual smart mounts 60 by dicing wafer 20, contact plugs 40 are plated with a metal or metal alloy to prepare surfaces of the plugs for electrical bonding to an LD or other electrical component or circuit. Optionally, the plugs are plated using any of various plating methods known in the art, with tin or nickel, which metals are often used to facilitate various reflow and/or wire bonding procedures. Plating may be performed by an electroless plating process.

FIG. 2B schematically shows an LD 80 mounted to mounting surface 64 of a first contact plug 40 in smart mount 60. LD 80 may be mounted and electrically connected to the mounting surface using a conductive adhesive or epoxy to bond a cathode (not shown) of the LD to the mounting surface. A bond wire 82 may be used to connect an anode (not shown) of the LD to a second contact plug 40 in smart mount 60.

Smart mount 60, and its LD 80, may relatively easily be mounted to a printed circuit board (PCB, not shown) comprising or providing electrical connection to circuitry (not shown) for powering and controlling LD 80. Electrically connecting the circuitry to contact pads 70 connects the circuitry to the LD. Optionally LD 80 is connected to the circuitry by surface mounting the smart mount to the PCB contact pads on bottom surface 67 that are mirror images of contact pads 70 so that the mirror image contact pads make electrical contact with power traces on the PCB.

Figure 3A:
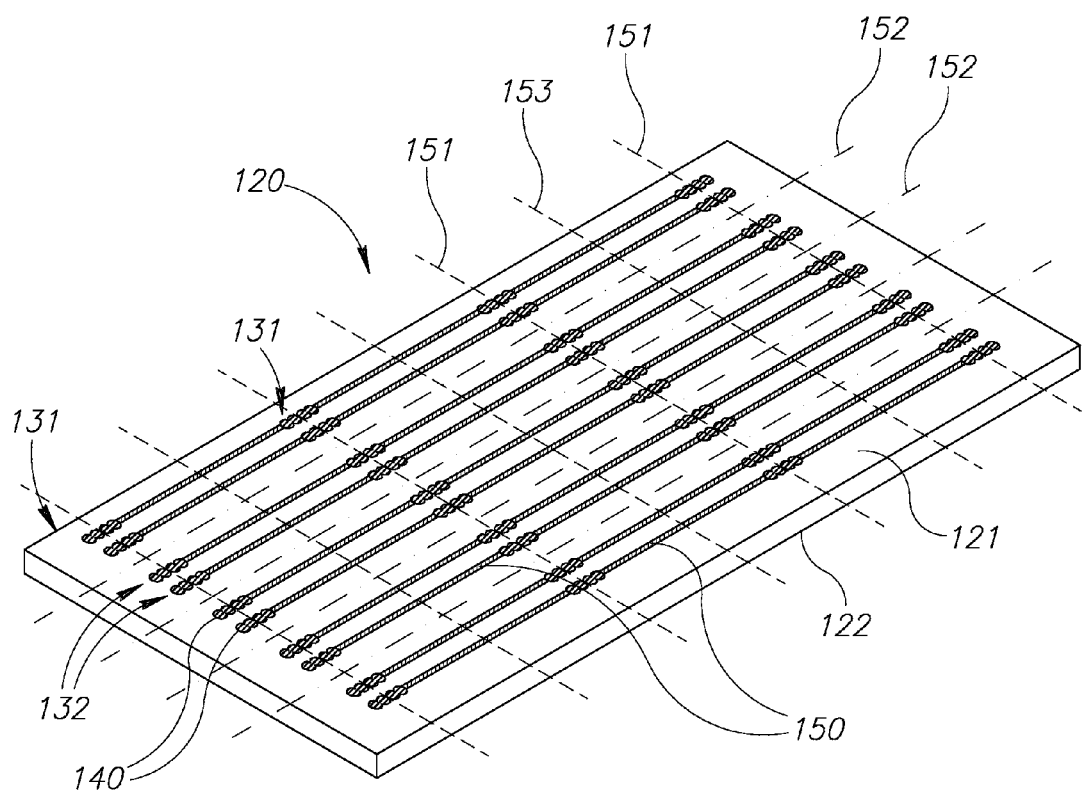
FIG. 3A schematically shows a substrate wafer similar to the substrate wafer shown in FIG. 1B, but having conducting tracks formed on a face surface of the substrate wafer, in accordance with an embodiment of the invention.

FIG. 3A schematically shows a substrate wafer 120, similar to wafer 20 shown in FIGS. 1A and 1B that has been processed to form, in addition to an array of rows 131 and columns 132 of contact plugs 140, conductive tracks 150, in accordance with an embodiment of the invention. Each conductive track 150 makes electrical contact with each of two contact plugs 140 in a same column 132 of contact plugs.

Figure 3B:
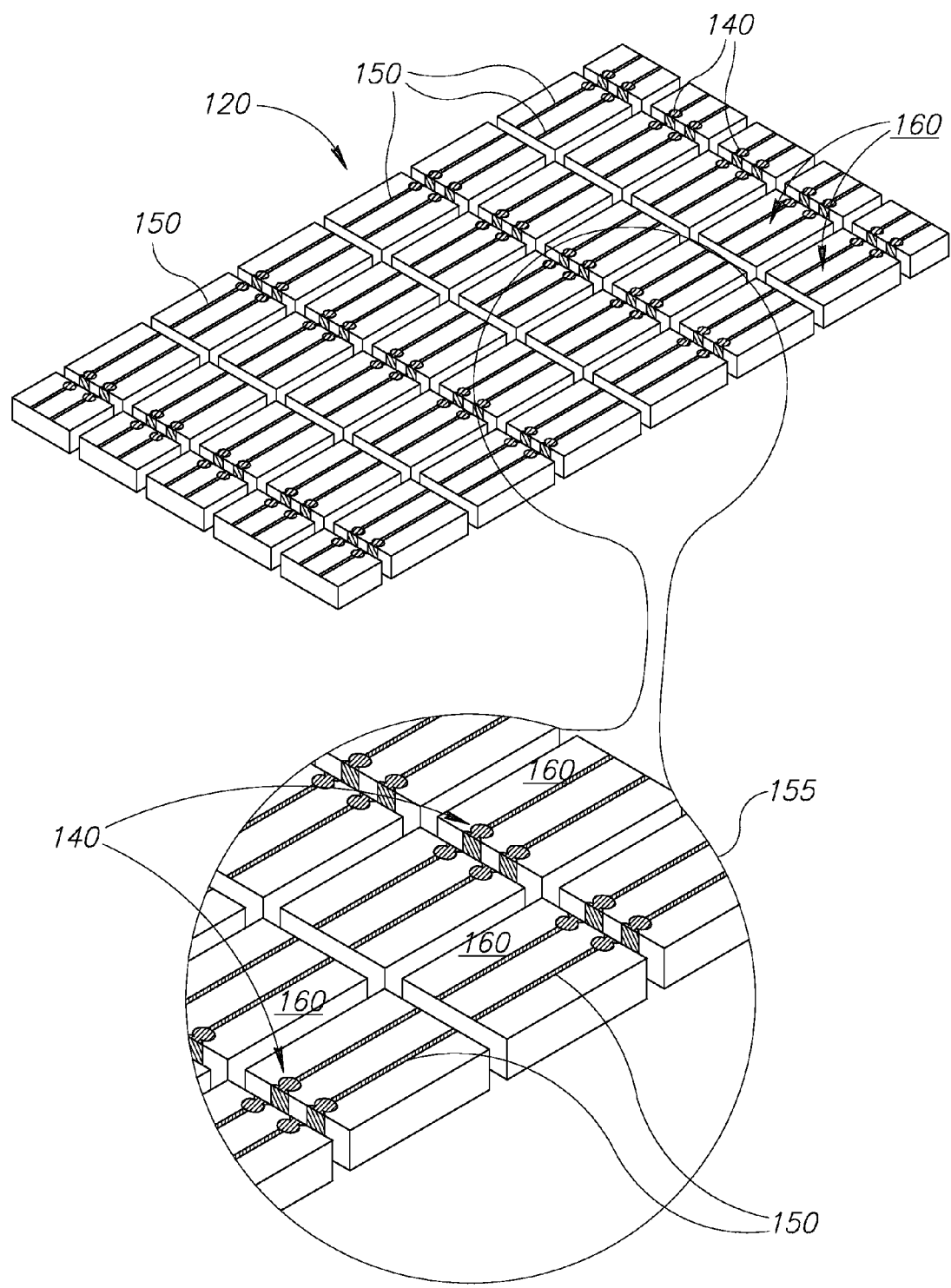
FIG. 3B schematically shows the substrate wafer shown in FIG. 3A, after dicing, in accordance with an embodiment with an embodiment of the invention.

Wafer 120 is diced by cutting along cutting lines 151, 152 and 153 to produce smart mounts 160 schematically shown in FIG. 3B. An inset 155 shows an enlarged image of a portion of diced wafer 120. Conductive tracks 150 may be formed by any of various lithography processes. The tracks provide convenient to use electrical contacts for electrically connecting a smart mount 160 to circuitry that may be used to power and/or control an LD mounted to the smart mount.

Figure 4A:
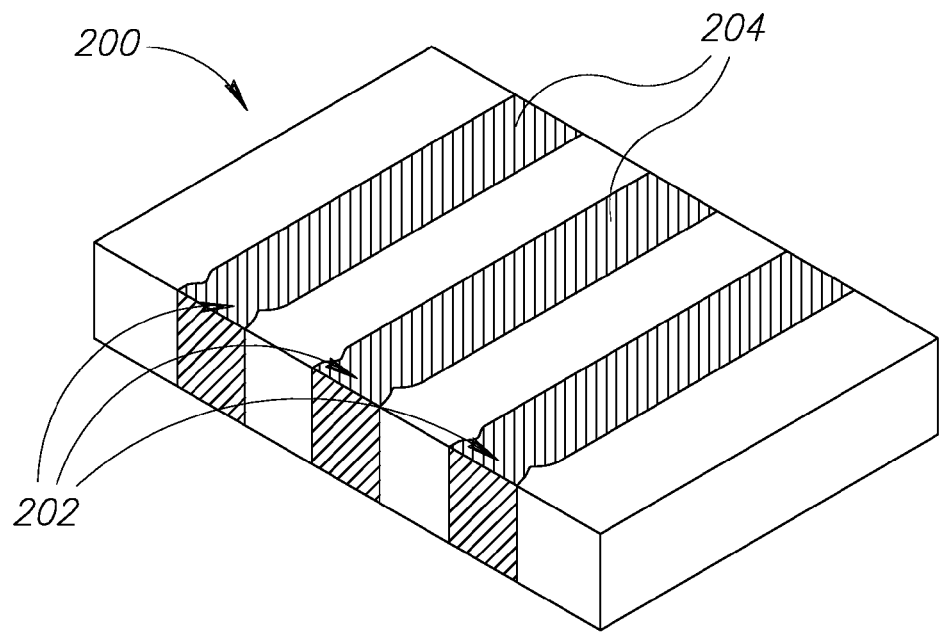
FIG. 4A schematically shows a smart mount resulting from dicing a substrate wafer having contact tracks, in accordance with an embodiment with an embodiment of the invention.

It is noted that whereas FIGS. 3A and 3B show contact tracks on a top surface 121 of wafer 120, in an embodiment of the invention, a wafer may be provided with contact tracks on both a top and bottom face surface so that electrical contact to resultant smart mounts may be made on both top and bottom surface of the smart mounts. It is also noted that whereas FIGS. 1A-3B show smart mounts having only two contact plugs, a smart mount in accordance with an embodiment of the invention is not limited to smart mounts having only two contact plugs. FIG. 4A schematically shows a smart mount 200 in accordance with an embodiment of the invention comprising three contact plugs 202 and associated contact tracks 204.

Nor are smart mounts in accordance with an embodiment of the invention limited to having contact plugs only along a same edge of the smart mount. For example, if wafers 20 and 120 are not cut along row cutting lines 53 and 153 in a dicing process of the wafers, smart mounts in accordance with an embodiment of the invention will have contact plugs on two opposite edges.

Figure 4B:
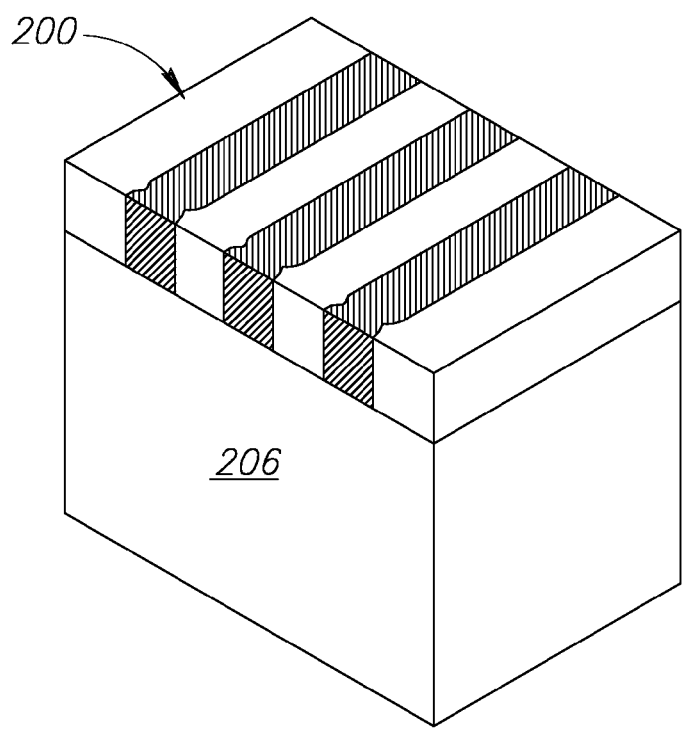
FIG. 4B schematically shows the smart mount shown in FIG. 4A mounted to a support pedestal, in accordance with an embodiment of the invention.

A smart mount in accordance with an embodiment of the invention may also be mounted on a pedestal to adjust height of the smart mount and an LD mounted to the smart mount to position the LD relative to optical and/or electrical components with which it is used and/or to provide the LD with a large heat sink. For example, if an LD is to be coupled to an optic fiber at a given fixed position a smart mount to which it is mounted may be required to be supported by a suitable pedestal to register position of the LD with an input aperture of the fiber. FIG. 4B schematically shows smart mount 200 supported by a pedestal 206 in accordance with an embodiment of the invention.

Practice of the invention is of course not limited to contact plug holes having a shape of plug holes 30 shown in FIG. 1A. Plug holes may have any shape suitable for locking contact plugs, which are formed by filling holes in a substrate wafer with a conductive material to the wafer.

Figure 5A:
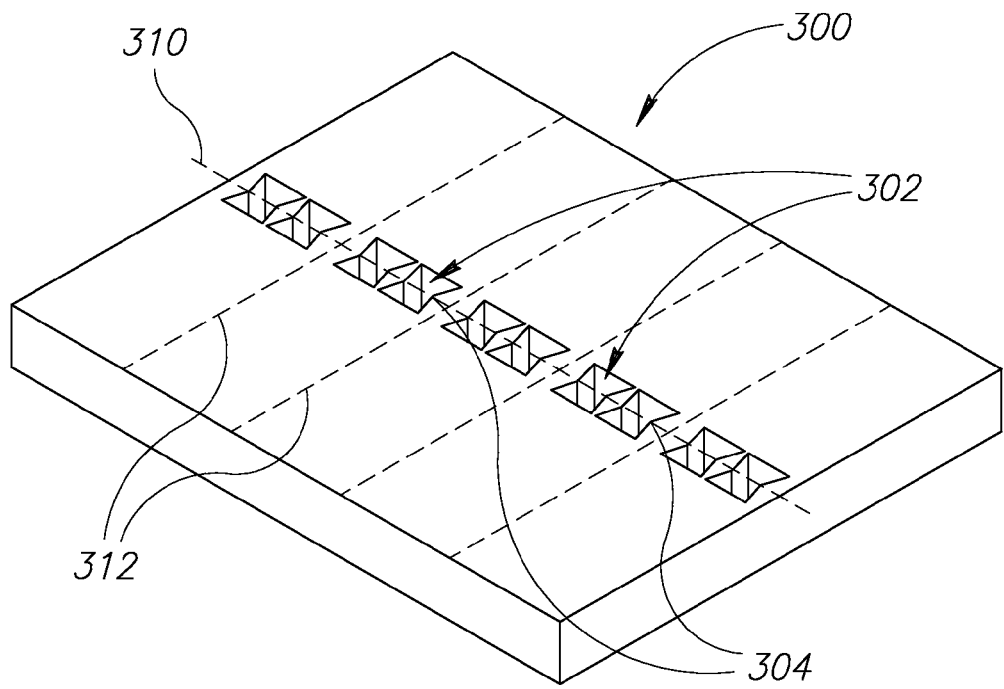
FIG. 5A schematically shows a substrate wafer formed having contact plug holes different from those shown in FIG. 1A, in accordance with an embodiment of the invention.

For example, FIG. 5A schematically shows a portion of a wafer 300 having plug holes 302 having an "hourglass" shape cross section, in accordance with an embodiment of the invention. Dashed lines 310 and 312 indicate a plug cutting line and column cutting lines respectively in the portion of the wafer shown in the figure. It is noted that unlike plug cutting lines 53 (FIG. 1B) and 153 (FIG. 3A) which pass between plug holes in their associated wafers, plug cutting line 310 passes through a narrow neck 304 of hourglass plug holes 302.

Figure 5B:
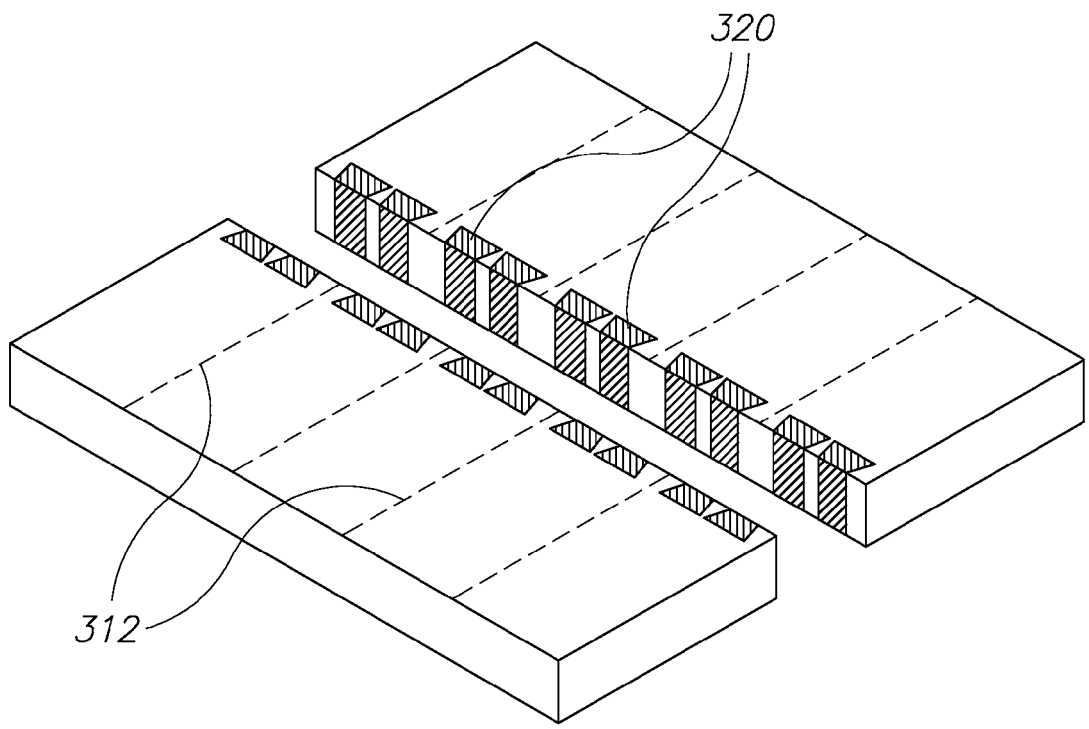
FIG. 5B schematically shows a portion of the substrate wafer shown in FIG. 4A after it has been cut along a row cutting line, in accordance with an embodiment of the invention.

FIG. 5B schematically shows wafer 300 after contact plug holes 302 have been filled with a conducting material and the wafer has been cut along plug cutting line 310 in a dicing process. Cutting wafer 300 along the plug cutting line forms contact plugs 320 having a trapezoidal cross section. Dicing of wafer 300 and singulation of smart mounts from the wafer is optionally completed by cutting the wafer along cutting lines 312. Were it desired to have a smart mount having, by way of example, ten contact plugs 320, cutting along cutting lines 312 shown in FIG. 5B may be foregone.

Figure 6:
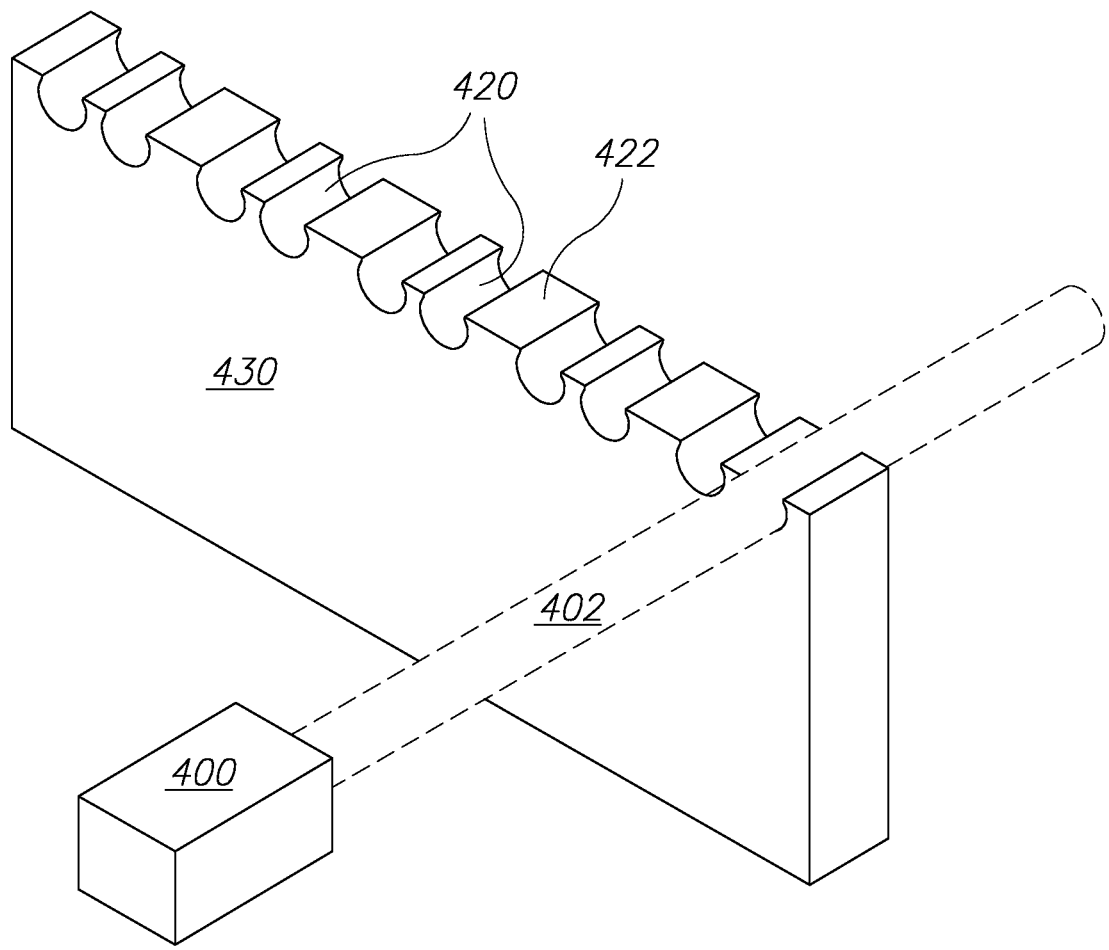
FIG. 6 schematically shows an alternative method for forming smart mounts in accordance with an embodiment of the invention.

It is noted that smart mounts in accordance with an embodiment of the invention may be manufactured by methods that are different from, or that are variations of, the methods described above. For example, FIG. 6 schematically shows a laser system 400 generating a laser beam 402 to cut contact plug "slots" 420 along an edge 422 of an, optionally ceramic, substrate "bar" 430. After cutting the slots, the substrate bar is held in a mold (not shown) with the slots at the top. A molten conductive metal or alloy is poured into the mold to cover and fill the slots and form contact plugs. After cooling, the substrate bar is removed and excess metal milled or abraded away to remove excess metal form edge 422 and planarize mounting surfaces of the contact plugs. By way of another example, rather than pour a molten metal or metal alloy into plug holes, such as plug holes 30 (FIG. 1A) or plug holes 302 (FIG. 5A) preformed contact plugs may be press fit into plug holes.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. A mount for a semiconductor device, the mount comprising:
    an insulating substrate having first and second parallel face surfaces, an edge surface that connects the parallel surfaces and having formed therein a recess having an opening on the first face surface;
    an electrically conductive plug seated in the recess and having a first exposed surface on or near the edge surface and a second exposed surface on or near the first face surface,
    wherein the recess and the plug is characterized by a cross section having a dimension substantially parallel to the edge surface at a first distance from the edge surface that is smaller than a dimension of the cross section at a second, larger distance from the edge surface.

2. A mount according to claim 1 and comprising a conductive track formed on the first face surface that electrically contacts the exposed surface of the plug on the first face surface.

3. A mount according to claim 1 wherein the plug has a second surface exposed on or near the second face surface.

4. A mount according to claim 3 and comprising a conductive track formed on the second face surface that electrically contacts the exposed surface of the plug on the second face surface.

5. A mount according to claim 1 wherein the cross section comprises a first region and a second region connected by a neck region, the neck region being characterized by a relatively small width substantially parallel to the edge surface, and the first and second regions being characterized by relatively large widths parallel to the narrow width of the neck region.

6. A mount according to claim 5 wherein the cross section has a periphery coincident with a periphery of an area defined by two circles that partially overlap.

7. A mount according to claim 1 wherein the cross section has a trapezoidal shape.

8. A mount according to claim 1 wherein the semiconductor device comprises a laser diode.

9. A method of producing a mount for a semiconductor device, the method comprising:
    forming a recess in a substrate formed from an electrically insulating material and having first and second parallel face surfaces, wherein the recess has an opening on the first face surface, and the recess is characterized by a cross section having a dimension parallel to and at a first distance from a line between the recesses in the pair of closely spaced rows to which the recess belongs that is smaller than a dimension of the cross section at a second, larger distance from the line;
    filling the recess with an electrically conductive material; and
    cutting the substrate to form an edge surface that connects the face surfaces and an exposed surface of the conductive material.

10. A method according to claim 9 wherein forming a recess comprises forming an array of rows and columns of recesses.

11. A method according to claim 10 wherein the rows comprise pairs of relatively closely spaced rows.

12. A method according to claim 9 wherein cutting the substrate comprises cutting the substrate along a line between a pair of closely spaced rows of recesses.

13. A method according to claim 9, wherein the cross section comprises a first region and a second region connected by a neck region, the neck region being characterized by a relatively small width substantially parallel to the edge surface, and the first and second regions being characterized by relatively large widths parallel to the narrow width of the neck region.

14. A method according to claim 13 wherein the cross section has a periphery coincident with a periphery of an area defined by two circles that partially overlap.

* * * * *